(12) United States Patent
Sakamoto

(10) Patent No.: US 11,013,117 B2
(45) Date of Patent: May 18, 2021

(54) ELECTRONIC DEVICE WITH BUILT IN FUSE

(71) Applicant: Murata Manufacturing Co., Ltd., Nagaokakyo (JP)

(72) Inventor: Hiroki Sakamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 686 days.

(21) Appl. No.: 15/367,501

(22) Filed: Dec. 2, 2016

(65) Prior Publication Data
US 2017/0086297 A1    Mar. 23, 2017

Related U.S. Application Data

(63) Continuation of application No. PCT/JP2015/067457, filed on Jun. 17, 2015.

(30) Foreign Application Priority Data

Jun. 26, 2014    (JP) .............................. JP2014-131175

(51) Int. Cl.
*H05K 1/18*    (2006.01)
*H01G 2/16*    (2006.01)
(Continued)

(52) U.S. Cl.
CPC .............. *H05K 1/181* (2013.01); *H01G 2/06* (2013.01); *H01G 2/16* (2013.01); *H01H 85/10* (2013.01);
(Continued)

(58) Field of Classification Search
CPC .......... G04R 20/10; G04R 60/12; H01G 2/06; H01G 2/065; H01G 2/14; H01G 2/16;
(Continued)

(56) References Cited

U.S. PATENT DOCUMENTS

| 4,894,746 A | * | 1/1990 | Mori | ........................ | H01G 2/14 361/275.4 |
| 6,013,938 A | * | 1/2000 | Ueuchi | ..................... | G05F 1/66 257/529 |

(Continued)

FOREIGN PATENT DOCUMENTS

| JP | S61-85133 U | 6/1986 |
| JP | H02-90507 A | 3/1990 |

(Continued)

OTHER PUBLICATIONS

International Search Report issued for PCT/JP2015/067457, dated Aug. 25, 2015.

(Continued)

*Primary Examiner* — Jared Fureman
*Assistant Examiner* — Nicolas Bellido
(74) *Attorney, Agent, or Firm* — Arent Fox LLP

(57) ABSTRACT

An electronic device that includes an intermediate connection layer interposed between a wiring substrate with a pair of land electrodes and an electronic component. The intermediate connection layer has first and second connection electrodes formed on the surface of a base. A fuse part is formed inside the second connection electrode between a main conductor part thereof opposed to a first external electrode of the electronic component and a main conductor part of the first connection electrode opposed to a second external electrode of the electronic component.

17 Claims, 7 Drawing Sheets

(51) Int. Cl.
*H01G 2/06* (2006.01)
*H01H 85/10* (2006.01)
*H01H 85/02* (2006.01)

(52) U.S. Cl.
CPC ....... *H05K 1/18* (2013.01); *H01H 2085/0275* (2013.01); *H05K 2201/10181* (2013.01)

(58) Field of Classification Search
CPC ........ H01G 4/002; H01G 4/008; H01G 4/012; H01G 4/12; H01G 4/1227; H01G 4/232; H01G 4/248; H01G 4/258; H01G 4/30; H01G 4/40; H01G 4/33; H01H 2085/0275; H01H 85/10; H01H 85/02; H01H 85/05; H02H 7/16; H03J 2200/10; H05K 1/02; H05K 1/18; H05K 1/181; H05K 2201/10015; H05K 2201/10181; H05K 2201/10636; H05K 3/341; H05K 3/4053; H05K 3/4611; H05K 1/028; H05K 1/0293; H05K 1/0298; H05K 1/0393; H05K 1/11; H05K 1/115; H05K 1/118; H05K 1/144; H05K 1/147; H05K 1/148; H05K 1/16; H05K 1/189; H05K 13/046; H05K 13/0465; H05K 2201/049; H05K 2201/05; H05K 2201/10515; H05K 2201/1053; H05K 2201/20; H05K 3/00; H05K 3/0052; H05K 3/12; H05K 3/303; H05K 3/3431; H05K 3/3442; H05K 3/3452; H05K 3/3494; H05K 3/363; H05K 3/4038; H05K 3/46; H05K 3/4691; H05K 1/141; H05K 2201/09181; Y02P 70/611; Y02P 70/613; Y02P 70/50
See application file for complete search history.

(56) References Cited

U.S. PATENT DOCUMENTS

| | | | |
|---|---|---|---|
| 8,254,816 B2 | 8/2012 | Mori | |
| 8,904,609 B2 | 12/2014 | Bultitude et al. | |
| 9,042,114 B2 | 5/2015 | Hattori et al. | |
| 9,082,550 B2 | 7/2015 | Hattori et al. | |
| 10,034,380 B2 * | 7/2018 | Sakamoto | H05K 1/189 |
| 10,340,682 B2 * | 7/2019 | Sakamoto | H05K 3/4611 |
| 10,446,488 B1 * | 10/2019 | Sherrima | H05K 3/4038 |
| 2007/0018774 A1 * | 1/2007 | Dietsch | H01H 85/0411 |
| | | | 337/159 |
| 2007/0075822 A1 * | 4/2007 | Pachla | H01H 85/0411 |
| | | | 337/297 |
| 2007/0175969 A1 * | 8/2007 | Wada | H05K 3/305 |
| | | | 228/180.1 |
| 2011/0043963 A1 | 2/2011 | Bultitude et al. | |
| 2011/0210814 A1 * | 9/2011 | Lu | H01H 85/0411 |
| | | | 337/296 |
| 2012/0079693 A1 | 4/2012 | Bultitude et al. | |
| 2014/0116768 A1 | 5/2014 | Hattori et al. | |
| 2014/0124256 A1 | 5/2014 | Hattori et al. | |
| 2014/0239973 A1 * | 8/2014 | Shiraishi | G01R 31/74 |
| | | | 324/550 |
| 2014/0240942 A1 * | 8/2014 | Itabashi | H01G 2/18 |
| | | | 361/772 |
| 2017/0359900 A1 * | 12/2017 | Sakamoto | H01G 4/30 |
| 2018/0041026 A1 * | 2/2018 | Sakamoto | H01G 2/06 |

FOREIGN PATENT DOCUMENTS

| | | | | |
|---|---|---|---|---|
| JP | H06-70938 B2 | | 9/1994 | |
| JP | H07-38359 B2 | | 4/1995 | |
| JP | 08018285 A | * | 1/1996 | |
| JP | H08-18285 A | | 1/1996 | |
| JP | 08222831 A | * | 8/1996 | |
| JP | H08-222831 A | | 8/1996 | |
| JP | 2010073805 A | * | 4/2010 | |
| JP | 2013-502746 A | | 1/2013 | |
| WO | WO 2013/008549 A1 | | 1/2013 | |
| WO | WO 2013/008550 A1 | | 1/2013 | |
| WO | WO-2016039260 A1 | * | 3/2016 | H05K 1/18 |

OTHER PUBLICATIONS

Written Opinion of the International Searching Authority issued for PCT/JP2015/067457, dated Aug. 25, 2015.

* cited by examiner

FIG. 10 - PRIOR ART

FIG. 11 - PRIOR ART
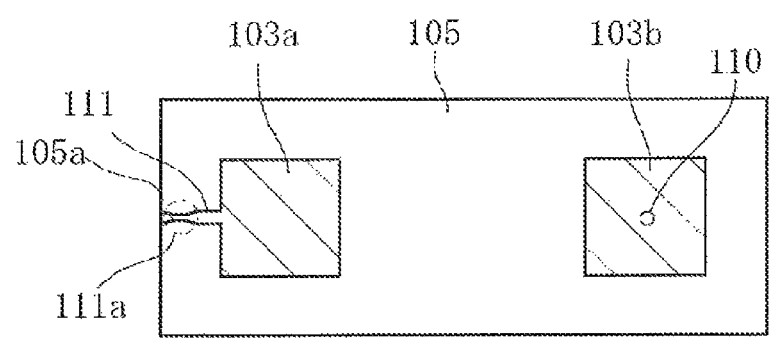
FIG. 12 - PRIOR ART
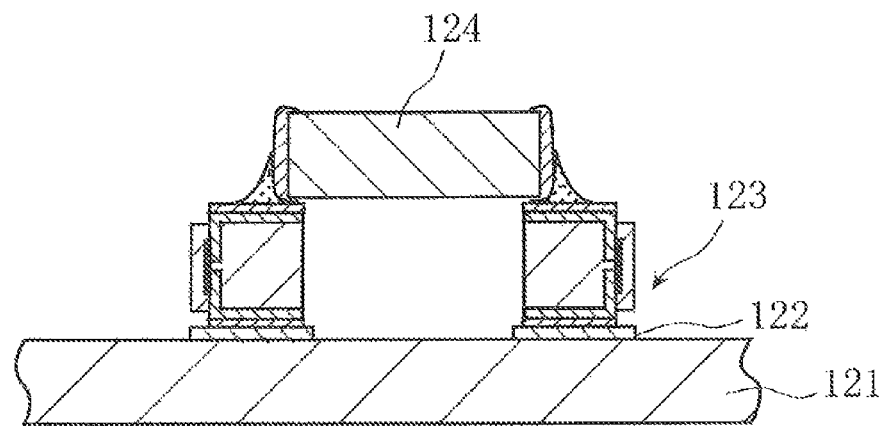

FIG. 13 - PRIOR ART
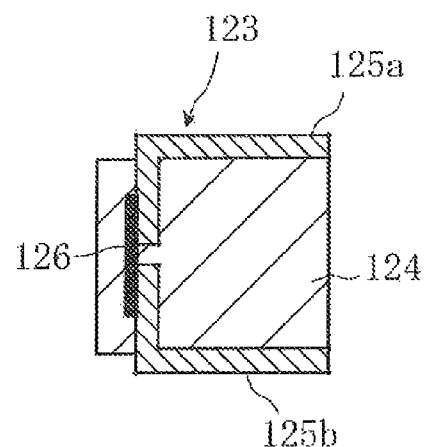

ELECTRONIC DEVICE WITH BUILT IN FUSE

CROSS REFERENCE TO RELATED APPLICATIONS

The present application is a continuation of International application No. PCT/JP2015/067457, filed Jun. 17, 2015, which claims priority to Japanese Patent Application No. 2014-131175, filed Jun. 26, 2014, the entire contents of each of which are incorporated herein by reference.

FIELD OF THE INVENTION

The present invention relates to an electronic device, and more particularly, relates to an electronic device with an electronic component such as a chip-type multilayer ceramic capacitor mounted on a substrate.

BACKGROUND OF THE INVENTION

Conventionally, electronic devices are known where electronic components such as chip-type multilayer ceramic capacitors are mounted on intermediate connection layers, with the intermediate connection layers interposed between the electronic components and substrates.

For example, Patent Document 1 proposes, as shown in FIG. 10, a device with a surface mounted component mounted, which includes a surface-mount wiring board 101, first land electrodes 102a, 102b provided on the surface of the surface-mount wiring board 101, an intermediate connection layer 105 with second land electrodes 103a, 103b and third land electrodes 104a, 104b respectively provided on both front and back surfaces, and a surface-mounted component 106, where the first land electrodes 102a, 102b and the third land electrodes 104a, 104b are electrically connected with solders 107a, 107b interpose therebetween, and the second land electrodes 103a, 103b and external electrodes 108a, 108b of the surface-mounted component 106 are electrically connected respectively with solders 109a, 109b.

FIG. 11 is a view on arrow along the line X-X of FIG. 10.

More specifically, in Patent Document 1, as shown in FIG. 11, the intermediate connection layer 105 has a conducting via 110 that electrically connects the second land electrode 103b and the third land electrode 104b, and the first land electrode 102b on the surface-mounted wiring board 101 is electrically connected to the external electrode 108b of the surface-mounted component 106, with the conducting via 110 interposed therebetween. Furthermore, in Patent Document 1, the intermediate connection layer 105 has a conductive pattern 111 of fine-line structure with a fuse 111a so as to suspend an end 105a, and the second land electrode 103a and the third land electrode 104a are electrically connected with the conductive pattern 111 interposed therebetween, thereby electrically connecting the land electrode 102a on the surface-mounted wiring board 101 to the external electrode 108a of the surface-mounted component 106.

In addition, Patent Document 2 proposes, as shown in FIG. 12, an electronic device that has an intermediate connection layer (a protection circuit component) 123 provided on land electrodes 122 of a substrate 121, and has an electronic component 124 mounted on the intermediate connection layer 123.

According to Patent Document 2, as shown in FIG. 13, the intermediate connection layer 123 has an insulating resin board 124, a pair of metal parts 125a, 125b provided on both sides of the insulating resin board 124 to be partially exposed, and a fuse part 126 for connecting the metal parts 125a, 125b.

In Patent Documents 1, 2, where the intermediate connection layer with the fuse function is interposed between the electronic component and the mounting substrate, even when a large current flows to the mounted electronic component, thereby breaking the electronic component, the fuse function makes the circuit open, thereby minimizing the influence on peripheral mounted parts, and prevent the mounting substrate from burning out, igniting, or the like.

Patent Document 1: Japanese Patent Application Laid-Open No. 8-18285 (claims 4, 5, paragraph numbers [0011], [0014], FIG. 1, FIG. 6, and others)

Patent Document 2: Japanese Patent Application Laid-Open No. 2-90507 (claim 1, FIGS. 1 and 2 and others)

SUMMARY OF THE INVENTION

However, in Patent Document 1 (FIGS. 10, 11), the fuse 111a is formed to suspend the end 105a of the intermediate connection layer 105 outside the surface-mounted component 106, thus resulting in a narrow region where the fuse 111a can be formed, and limiting the dimension of the fuse 111a in length. More specifically, it is difficult to ensure the adequate dimension of the fuse 111a in length, and for this reason, even when the fuse 111a melts down, there is a possibility of resulting in failure to function as a fuse without being able to interrupt current due to arc discharge.

In order to ensure the adequate length of the fuse 111a, there is a need to increase the fuse formation region outside the intermediate connection layer 105. However, in this case, the dimensions of the intermediate connection layer 105 in the long-side direction and the width direction have to be increased, thereby unfavorably causing an increase in the size of the device itself.

In addition, Patent Document 2 (FIGS. 12, 13) has a similar problem to that of Patent Document 1, because the fuse 126 is formed in the height direction of the intermediate connection layer 123, and in order to ensure the adequate length of the fuse 126, the height itself of the intermediate connection layer 123 has to be increased, which is unfavorably contrary to the request of reduction in thickness.

As just described, conventionally, when an attempt is made to ensure an adequate fuse function for an electronic device, the degree of freedom for fuse design is low because of the increased size of the device itself, and for this reason, the appearance of small-size electronic devices with an adequate fuse function have been expected.

The present invention has been achieved in view of these circumstances, and an object of the invention is to provide an electronic device which can ensure a desired fuse function without causing the device itself to undergo an increase in size.

In order to achieve the object, an electronic device according to the present invention is an electronic device including a substrate with a plurality of land electrodes, and an electronic component mounted on the substrate. The electronic device is characterized in that an intermediate connection layer is interposed between the substrate and the electronic component, the intermediate connection layer includes a plurality of connection electrodes that electrically connect the land electrodes and the electronic component, formed on both principal surfaces of the intermediate connection layer, and at least one of the connection electrodes has a fuse part formed therein.

In addition, in the electronic device according to the present invention, the fuse part is preferably formed in a narrowed shape in a long-side direction of the intermediate connection layer.

Thus, the fuse part is formed in a large region inside the connection electrode, thereby increasing the degree of design freedom for the fuse part, and allowing the fuse part to ensure an adequate length. Therefore, the trouble of failing to interrupt current due to arc current even after fuse melting can be avoided without causing the device itself to undergo an increase in size.

Furthermore, in the electronic device according to the present invention, the fuse part is also preferably formed in a narrowed shape in a short-side direction of the intermediate connection layer.

More specifically, in mounting onto the substrate, typically, a solder is melted and cooled in accordance with a reflow process, thereby achieving the mounting onto the substrate. Then, while bending stress is generated in the long-side direction of the intermediate connection layer in cooling the solder, the formation of the fuse part in the short-side direction of the intermediate connection layer makes it possible to suppress the generation of strain in the fuse, which is caused by deformations of the intermediate connection layer.

In addition, in the electronic device according to the present invention, the fuse part is also preferably formed by bonding connection of a metal wire in the connection electrode.

In this case, it is possible to avoid the fuse part being brought into direct contact with the base of the intermediate connection layer, and accordingly, the heat conduction from the fuse part to the intermediate connection layer is suppressed, thereby making it possible to reduce the meltdown time, and prevent the intermediate connection layer from igniting.

In addition, in the electronic device according to the present invention, the fuse part is preferably formed on a surface opposed to the electronic component.

More specifically, the substrate is typically formed mainly from a resin material such as a glass-epoxy resin which is inferior in heat resistance, and the electronic component is formed mainly from a ceramic material which has favorable heat resistance. Thus, the formation of the fuse part on the surface opposed to the electronic component can effectively prevent the substrate from igniting, smoking, burning out, and the like, even when the fuse part melts down, and thus generates heat.

In addition, in the electronic device according to the present invention, the fuse part may be formed on a surface opposed to the substrate.

In addition, in the electronic device according to the present invention, preferably, a conducting via is formed in the intermediate connection layer, and the connection electrodes formed on the both principal surfaces are electrically connected through the conducting via.

In this case, the connection electrodes formed on the both principal surfaces are electrically connected through the conducting via, and the electronic component is thus easily mounted on the substrate with the intermediate connection layer interposed therebetween. Further, when a large current flows to the circuit, the fuse part melts down to make the circuit open, thereby making it possible to prevent the electronic device from igniting or burning.

In addition, in the electronic device according to the present invention, preferably, one principal surface of the intermediate connection layer has the connection electrode formed to have an extended part on a side surface of the intermediate connection layer, the other principal surface of the intermediate connection layer has the connection electrode formed along the side surface of the intermediate connection layer, and the connection electrode formed on the one principal surface and the connection electrode formed on the other principal surface are electrically connected through the side surface of the intermediate connection layer.

Thus, it becomes possible to achieve an electronic device that has a desired fuse function at low cost without the need to form any conducting via. Moreover, the dimension in the long-side direction of the electronic component is larger than the dimension in the width direction perpendicular to the long-side direction, and the distance between the connection electrodes can be thus shortened, thus making it possible to improve the flexure strength of the intermediate connection layer.

Furthermore, in the electronic device according to the present invention, the intermediate connection layer preferably has a metal film formed on an end surface of the layer, or has a metal film formed on a side surface of the intermediate connection layer.

Thus, the joints between the substrate and the intermediate connection layer spread toward the bottom in the case of soldering, thereby making it possible to easily form favorable fillets, and thus achieve favorable finish.

It is to be noted that in the present invention, the long-side direction is considered to correspond to the side surface, whereas the short-side direction is considered to correspond to the end surface.

With the electronic device described herein, as compared with the devices in Patent Documents 1 and 2, the degree of freedom for fuse design is increased, thereby making it possible to increase the fuse formation region, even without causing the device to undergo an increase in size. Further, the fuse part can ensure a sufficient length, thereby making it possible to avoid the trouble of failing to interrupt current due to arc current after fuse melting, and thus achieve an electronic device with a favorable fuse function.

BRIEF EXPLANATION OF THE DRAWINGS

FIG. 10 is a cross-sectional view of a device with a surface-mounted component mounted, which is disclosed in Patent Document 1.

FIG. 11 is a view on arrow along the line X-X of FIG. 11.

FIG. 12 is a cross-sectional view of an electronic device as disclosed in Patent Document 2.

FIG. 13 is a detailed cross-sectional view of a protection circuit component for mounting, which is disclosed in Patent Document 2.

DETAILED DESCRIPTION OF THE INVENTION

Next, embodiments of the present invention will be described in detail with reference to the accompanying drawings.

Figure 1:
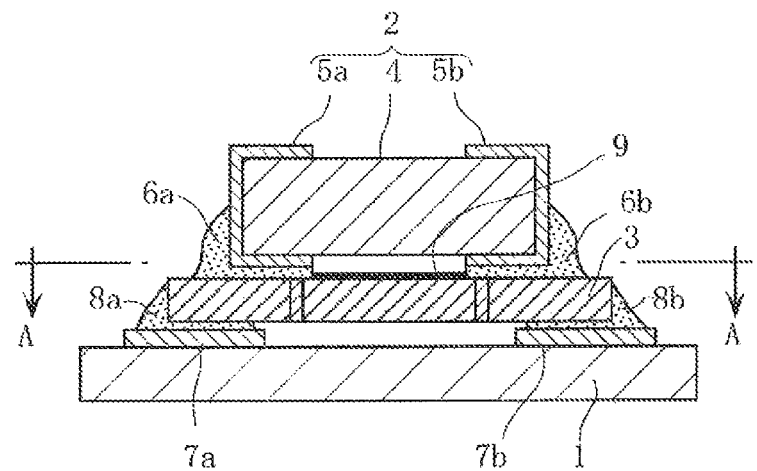
FIG. 1 is a cross-sectional view illustrating an embodiment (first embodiment) of an electronic device according to the present invention.

FIG. 1 is a cross-sectional view schematically illustrating an embodiment (first embodiment) of an electronic device according to the present invention.

This electronic device has a wiring substrate 1 with first and second land electrodes 7a, 7b formed on the surface; and an electronic component 2 such as a chip-type multilayer ceramic capacitor formed mainly from a ceramic material. The electronic component 2 is mounted on an intermediate connection layer 3 interposed between the wiring substrate 1 and the electronic component 2.

Specifically, the electronic component 2 has first and second external electrodes 5a, 5b respectively formed on both ends of a component body 4 of a ceramic material. The first and second external electrodes 5a, 5b are connected to first and second connection electrodes formed on the surface (one principal surface) of the intermediate connection layer 3, with solders 6a, 6b interposed therebetween. In addition, the first and second land electrodes 7a, 7b formed on the surface of the wiring substrate 1 are connected to third and fourth connection electrodes formed on the back surface (the other principal surface) of the intermediate connection layer 3, with solders 8a, 8b interposed therebetween.

Further, the intermediate connection layer 3 has a fuse part 9 formed on the surface opposed to the electronic component 2.

Figure 2:
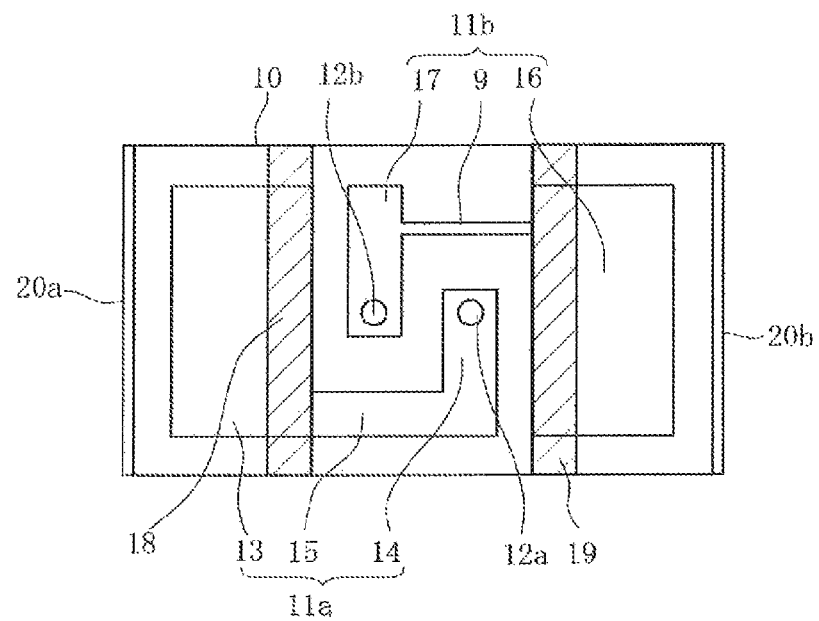
FIG. 2 is a plan view of an intermediate connection layer according to the first embodiment.

FIG. 2 is a view on arrow along the line A-A of FIG. 1, which shows a plan view of the intermediate connection layer 3.

The intermediate connection layer 3 has first and second connection electrodes 11a, 11b on the surface of a base 10 on a flat plate of a resin material such as a glass-epoxy resin.

The first connection electrode 11a has a main conductor part 13 formed on the surface opposed to the first external electrode 5a, a sub-conductor part 14 formed substantially in the central part of the base 10, and a connection conductor part 15 that connects the main conductor part 13 and the sub-conductor part 14. In addition, a first conducting via 12a is formed at a distal end of the sub-conductor part 14, so as to pass through the base 10.

In addition, the second connection electrode 11b has a main conductor part 16 formed on the surface opposed to the second external electrode 5b, a sub-conductor part 17 formed substantially in the central part of the base 10, so as not to be brought into contact with the first connection electrode 11a, and a fuse part 9 formed in a narrowed shape, for connecting the main conductor part 16 and the sub-conductor part 17. In addition, a second conducting via 12b is formed at a distal end of the sub-conductor part 17 of the second connection electrode 11b, so as to pass through the base 10.

In addition, on the surface of the intermediate connection layer 3, protective layers 18, 19 of a solder resist or the like are formed so that the first connection electrode 11a and the second electrode 11b are kept from coming into electrical contact with each other even when the solders 6a, 6b flow therein.

In addition, metal films 20a, 20b are formed on both end surfaces of the intermediate connection layer 3, so as to make it easy for the solders 8a, 8b to form fillets.

It is to be noted that the metal material for use in the metal films 20a, 20b is not to be considered particularly limited, but the films are typically formed from the same metal material as the first and second connection electrodes 11a, 11b or third and fourth connection electrodes 21a, 21b described below. For example, when the first to fourth connection electrodes 11a, 11b, 21a, 21b are formed from Cu, the metal films 20a, 20b are typically also formed from Cu.

Figure 3:
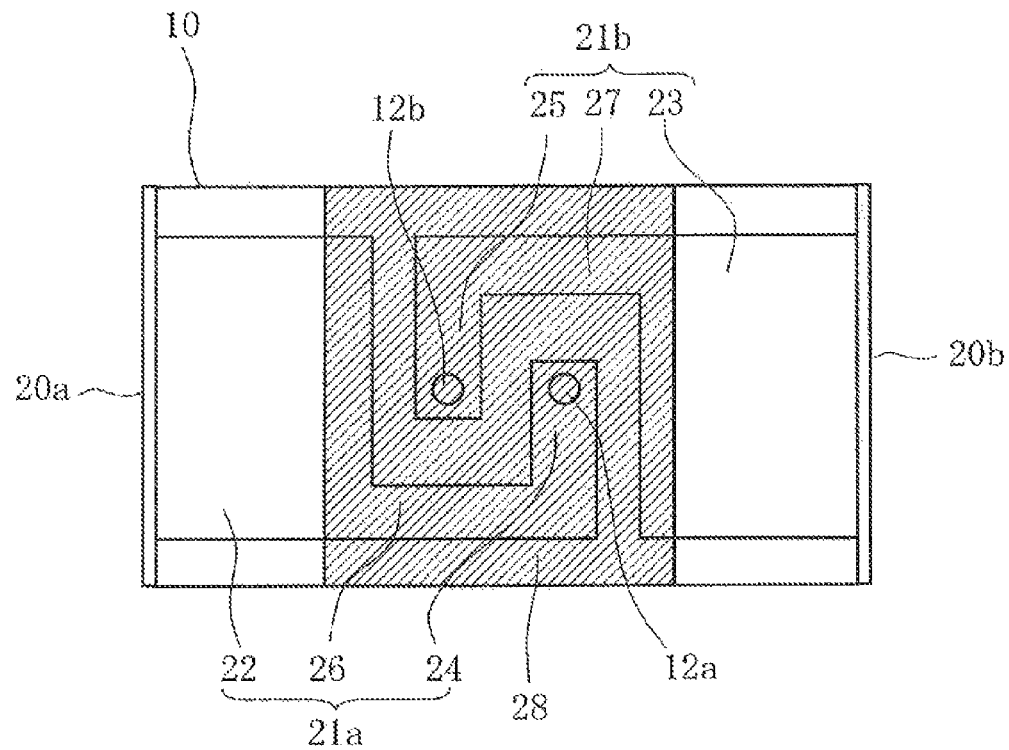
FIG. 3 is a bottom view of the intermediate connection layer according to the first embodiment.

FIG. 3 is a bottom view of the intermediate connection layer 3.

On the back surface of the intermediate connection layer 3, the third and fourth connection electrodes 21a, 21b are formed respectively in substantially U-shaped forms from the end surfaces toward substantially central parts. More specifically, the third connection electrode 21a and the fourth connection electrode 21b are formed in an antisymmetric form, so as not to come into contact with each other, and the third connection electrode 21a and the fourth connection electrode 21b have main conductor parts 22, 23 formed on the surfaces opposed to the first land electrode 7a and the second land electrode 7b, sub-conductor parts 24, 25 with the first conducting via 12a and the second conducting via 12b, and connection conductor parts 26, 27 that connect the main conductor parts 22, 23 and the sub-conductor parts 24, 25.

Further, the third connection electrode 21a is electrically connected to the first connection electrode 11a through the first conducting via 12a, whereas the fourth connection electrode 21b is electrically connected to the second connection electrode 11b through the second conducting via 12b.

In addition, on a central part of the back surface of the intermediate connection layer 3, a protective layer 28 of a solder resist or the like is formed so that the third connection electrode 21a and the fourth electrode 21b are kept from coming into electrical contact with each other even when the solders 8a, 8b flow therein.

In the thus configured electronic device, even when a large current flows to the mounted electronic component 2, thereby breaking the electronic component 2, the fuse part 9 melts down to make the circuit open, thereby making it possible to minimize the influence on peripheral mounted parts, and prevent the mounting substrate from burning out, igniting, or the like.

Further, the fuse part 9 is formed inside the second connection electrode 11b, that is, between one main conductor part 13 as a surface opposed to the first external electrode 5a and the other main conductor part 16 as a surface opposed to the second external electrode 5b. Thus, as compared with cases of forming the fuse part near the end of the intermediate connection layer 3 or in the height direction of the intermediate connection layer 3 as in conventional cases, the degree of freedom for fuse design is increased without increasing the size or height of the device, thereby making it possible to avoid the trouble of failing to interrupt current due to arc current after fuse melting, and thus achieve an electronic device with a favorable fuse function.

In addition, the wiring substrate 1 is formed mainly from a resin material such as a glass-epoxy resin which is inferior in heat resistance, and the electronic component 2 is formed mainly from a ceramic material which has favorable heat resistance. Thus, in the present embodiment, because the fuse part 9 is provided on the surface opposed to the electronic component 2, the wiring substrate 1 can be effectively prevented from igniting, smoking, burning out, and the like, even when the fuse part 9 melts down, and thus generates heat.

In addition, because the intermediate connection layer 3 has the metal films 20*a*, 20*b* formed on the end surfaces, the joints between the wiring substrate 1 and the intermediate connection layer 3 spread toward the bottom in the case of soldering, thereby making it possible to easily form favorable fillets, and thus achieve favorable finish.

It is to be noted that this intermediate connection layer 3 can be easily prepared in the following way.

More specifically, a large-sized collective board with a metal thin film such as Cu formed on the surface is prepared, which serves as an assembly of bases 10. Then, first, with a drill, holes are provided in positions for the formation of conducting vias, and openings are further provided in positions to serve as end surfaces of the bases 10. Next, this collective board is subjected to electrolytic plating to fill the inside of the holes with a metal material, thereby forming the first and second conducting vias 12*a*, 12*b*, and the metal films 20*a*, 20*b* are formed on the inner surfaces of the openings. Next, the first to fourth connection electrodes 11*a*, 11*b*, 21*a*, 21*b* are formed with the use of a well-known technique of photolithography. Then, a solder resist is applied onto predetermined locations of both front and back surfaces of the bases 10, and dried and subjected to heat treatment to prepare the protective layers 18, 19, 28.

Next, a predetermined number of electronic components 2 is placed on the collective board, and subjected to soldering treatment to join the first and second external electrodes 5*a*, 5*b* to the first and second connection electrodes 11*a*, 11*b*. Then, this is cut into predetermined dimensions with a cutter such as a dicer, and separated into individual pieces, thereby preparing the intermediate connection layer 3.

Then, the intermediate connection layer 3 with the electronic component 2 subjected to soldering in this way is placed on the wiring substrate 1, and subjected to soldering to join the first and second land electrodes 7*a*, 7*b* to the third and fourth connection electrodes 21*a*, 21*b*, thereby making it possible to prepare the electronic device shown in FIG. 1.

Next, a second embodiment of the electronic device according to the present invention will be described.

According to the second embodiment, an electronic component and a wiring substrate are configured in the same manner as in the first embodiment, whereas an intermediate connection layer has a different structure.

Figure 4:
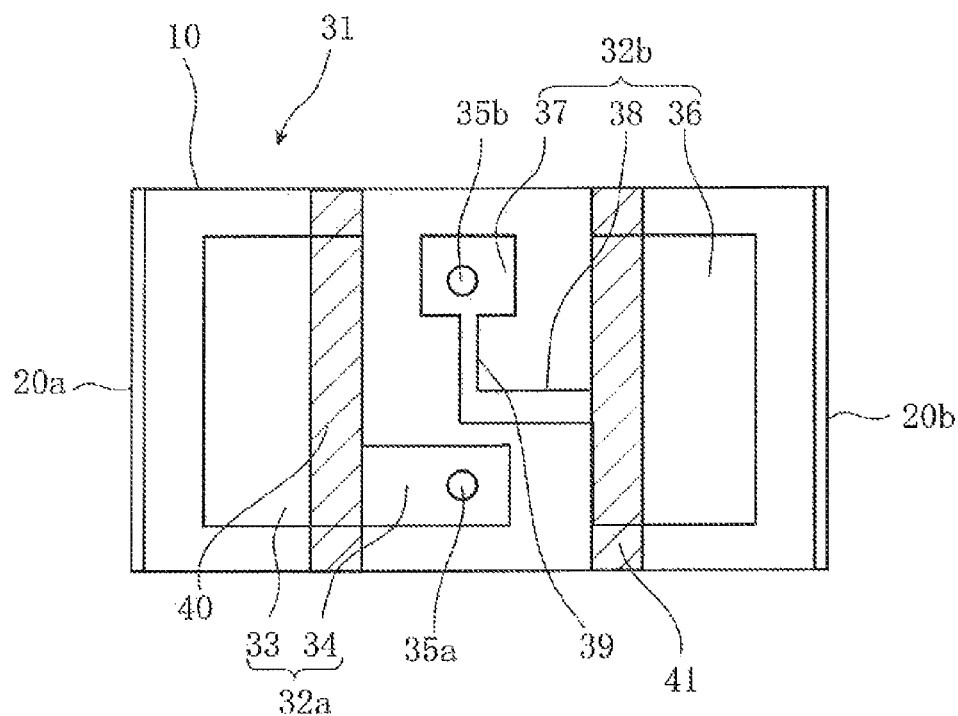
FIG. 4 is a plan view illustrating an intermediate connection layer in a second embodiment of an electronic device according to the present invention.

FIG. 4 is a plan view of the intermediate connection layer according to the second embodiment.

On the surface of the intermediate connection layer 31, a first connection electrode 32*a* and a second connection electrode 32*b* are formed as in the first embodiment.

The first connection electrode 32*a* has a main conductor part 33 formed on the surface opposed to a first external electrode 5*a*, and a sub-conductor part 34 formed by bending a distal end of the main conductor part 33 into an L-shaped form, and has a first conducting via 35*a* formed near a distal end of the sub-conductor part 34.

The second connection electrode 32*b* has a main conductor part 36 formed on the surface opposed to the second external electrode 5*b*, a sub-conductor part 37 formed substantially in the central part, and a connection conductor part 38 formed in an L-shaped form for connecting the main conductor part 36 and the sub-conductor part 37. Then, the sub-conductor part 37 has a second conducting via 35*b* formed therein, and the connection conductor part 38 is narrowed near the connection point with the sub-conductor part 37, thereby forming a fuse part 39.

In addition, on the surface of the intermediate connection layer 31, protective layers 40, 41 of solder resist or the like are formed so that the first connection electrode 32*a* and the second electrode 32*b* are kept from coming into electrical contact with each other even when solders 6*a*, 6*b* flow therein.

In addition, as in the first embodiment, metal films 20*a*, 20*b* are formed on both end surfaces of the intermediate connection layer 31, so as to make it easier for solders 8*a*, 8*b* to form fillets.

Figure 5:
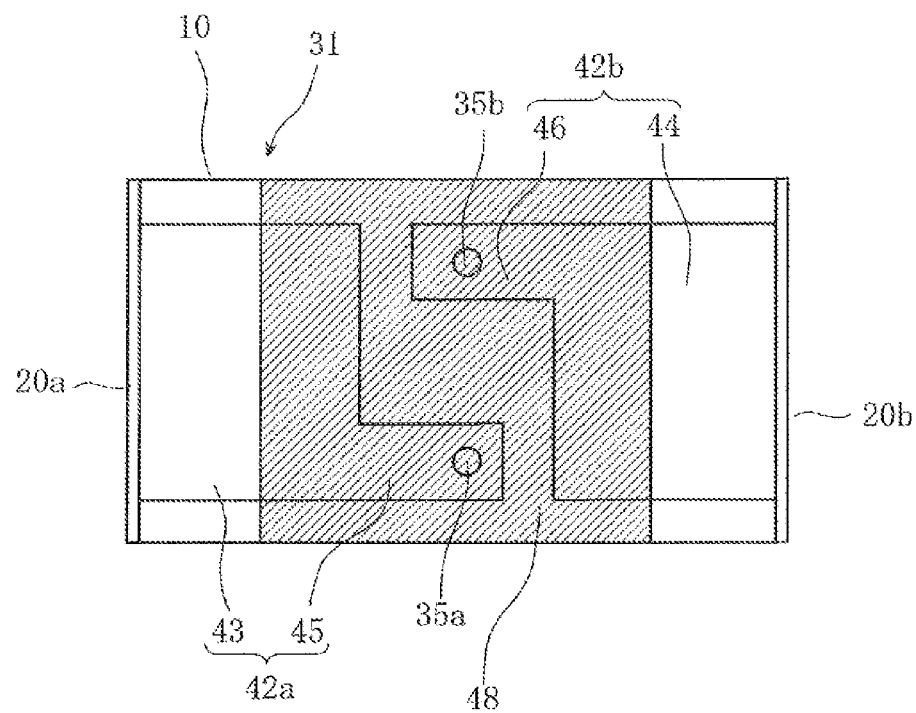
FIG. 5 is a bottom view of the second embodiment.

FIG. 5 is a bottom view of the intermediate connection layer 31.

More specifically, on the back surface of the intermediate connection layer 31, L-shaped third and fourth connection electrodes 42*a*, 42*b* are formed respectively from the end surfaces toward substantially central parts, as in the first embodiment. More specifically, the third connection electrode 42*a* and the fourth connection electrode 42*b* are formed in an antisymmetric form, so as not to come into contact with each other, and the third connection electrode 42*a* and the fourth connection electrode 42*b* have main conductor parts 43, 44 formed on the surfaces opposed to a first land electrode 7*a* and a second land electrode 7*b*, and sub-conductor parts 45, 46 with a first conducting via 35*a* and a second conducting via 35*b*, which are connected to the main conductor parts 43, 44.

Further, the third connection electrode 42*a* is electrically connected to the first connection electrode 32*a* through the first conducting via 35*a*, whereas the fourth connection electrode 42*b* is electrically connected to the second connection electrode 32*b* through the second conducting via 35*b*.

In addition, on a central part of the back surface of the intermediate connection layer 31, a protective layer 48 of a solder resist or the like is formed so that the third connection electrode 42*a* and the fourth connection electrode 42*b* are kept from coming into electrical contact with each other even when the solders 8*a*, 8*b* flow therein.

In the thus configured electronic device, as in the first embodiment, even when a large current flows to the mounted electronic component 2, thereby breaking the electronic component 2, the fuse part 39 melts down to make the circuit open, thereby making it possible to minimize the influence on peripheral mounted parts, and prevent the mounting substrate from burning out, igniting, or the like.

Further, the fuse part 39 is formed inside the second connection electrode 32*b*, that is, between one main conductor part 33 as a surface opposed to the first external electrode 5*a* and the other main conductor part 36 as a surface opposed to the second external electrode 5*b*. Thus, as compared with cases of forming the fuse part near the end of the intermediate connection layer 31 or in the height direction of the intermediate connection layer 31 as in conventional cases, the degree of freedom for fuse design is increased without increasing the size or height of the device, thereby making it possible to avoid the trouble of failing to interrupt current due to arc current after fuse melting, and thus achieve an electronic device with a favorable fuse function.

Moreover, in this second embodiment, the fuse part 39 is formed in the short-side direction of the intermediate connection layer 31, and the generation of strain associated with stress generated in mounting onto the substrate can be thus suppressed as compared with the first embodiment. More specifically, in mounting onto the substrate, typically, a solder is melted and cooled in accordance with a reflow process, thereby achieving the mounting onto the substrate. Then, while bending stress is generated in the long-side direction of the intermediate connection layer in cooling the solder, the formation of the fuse part 39 in the short-side direction of the intermediate connection layer 10 makes it possible to suppress the generation of strain of the fuse, which is caused by deformations of the intermediate connection layer 10.

Next, a third embodiment of the electronic device according to the present invention will be described.

According to the present third embodiment, an electronic component and a wiring substrate are configured in the same manner as in the first and second embodiments, whereas an intermediate connection layer has a different structure.

Figure 6:
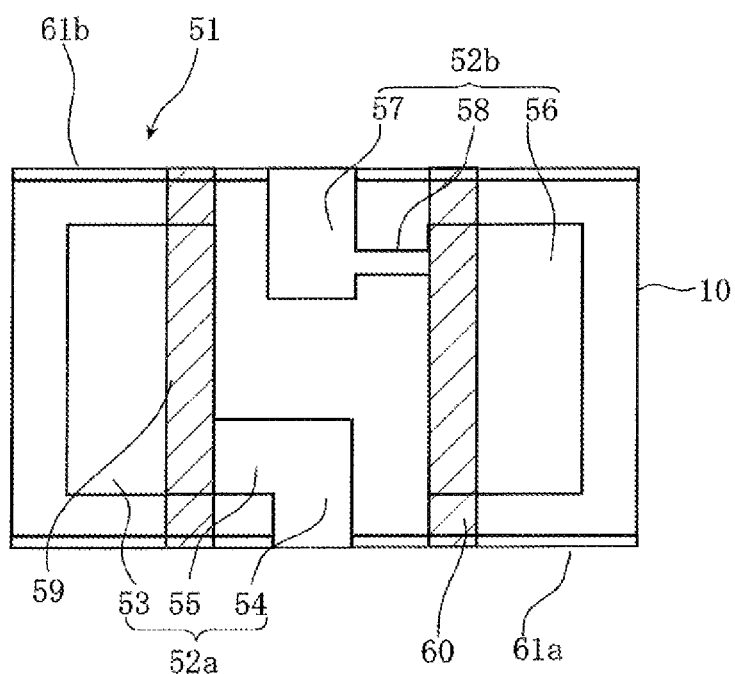
FIG. 6 is a plan view illustrating an intermediate connection layer in a third embodiment of an electronic device according to the present invention.

FIG. 6 is a plan view of the intermediate connection layer according to the third embodiment.

On the surface of an intermediate connection layer 51, a first connection electrode 52a and a second connection electrode 52b are formed as in the first and second embodiments.

The first connection electrode 52a has a main conductor part 53 formed on the surface opposed to a first external electrode 5a, an extended part 54 exposed to one side surface, and a connection conductor part 55 that connects the main conductor part 53 and the extended part 54.

The second connection electrode 52b has a main conductor part 56 formed on the surface opposed to a second external electrode 5b, an extended part 57 exposed to one side surface, and a fuse part 58 formed in a narrowed shape for connecting the main conductor part 56 and the extended part 57.

In addition, on the surface of the intermediate connection layer 51, protective layers 59, 60 of a solder resist or the like are formed so that the first connection electrode 52a and the second electrode 52b are kept from coming into electrical contact with each other even when solders 6a, 6b flow therein.

In addition, as in the first embodiment, metal films 61a, 61b are formed on both the side surfaces of the intermediate connection layer 51, so as to make it easier for solders to form fillets.

Figure 7:
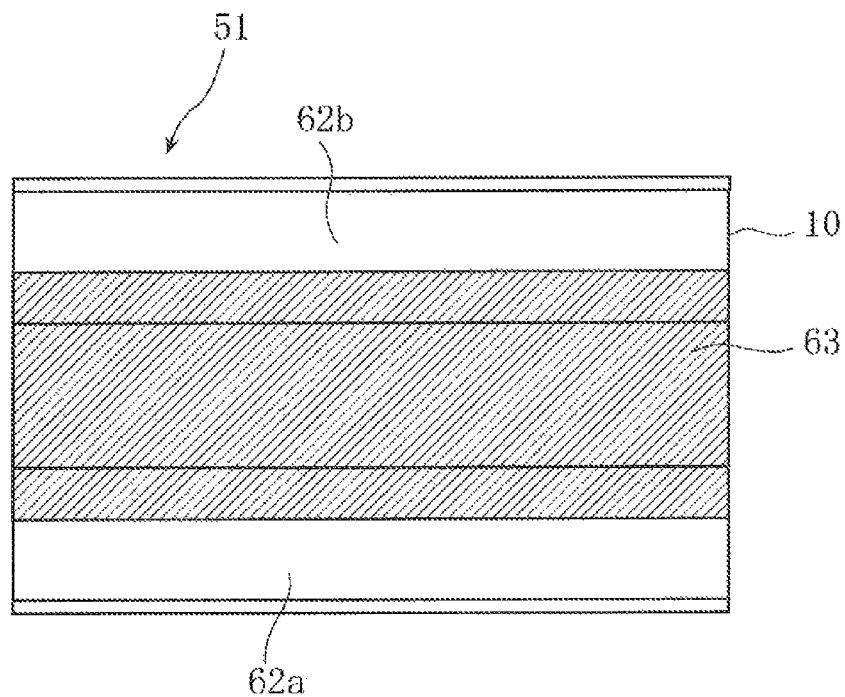
FIG. 7 is a bottom view of the third embodiment.

FIG. 7 is a bottom view of the intermediate connection layer 51.

More specifically, on the back surface of the intermediate connection layer 51, third and fourth connection electrodes 62a, 62b are formed so as to be kept from coming into contact with each other, but opposed to first and second land electrodes in the long-side direction.

In addition, the third connection electrode 62a is electrically connected to the first connection electrode 52a with the metal film 61a interposed therebetween, whereas the fourth connection electrode 62b is electrically connected to the second connection electrode 52b with the metal film 61b interposed therebetween.

Further, on a central part of the back surface of the intermediate connection layer 51, a protective layer 63 of a solder resist or the like is formed so that the third connection electrode 62a and the fourth electrode 62b are kept from coming into electrical contact with each other even when solders 8a, 8b flow therein.

In the thus configured electronic device, as in the first and second embodiments, even when a large current flows to the mounted electronic component 2, thereby breaking the electronic component 2, the fuse part 58 melts down to make the circuit open, thereby making it possible to minimize the influence on peripheral mounted parts, and prevent the mounting substrate from burning out, igniting, or the like.

Further, the fuse part 58 is formed inside the second connection electrode 52b, that is, between one main conductor part 53 as a surface opposed to the first external electrode 5a and the other main conductor part 56 as the other surface opposed to the second external electrode 5b. Thus, as compared with cases of forming the fuse part near the end of the intermediate connection layer 51 or in the height direction of the intermediate connection layer 51 as in conventional cases, the degree of freedom for fuse design is increased without increasing the size or height of the device, thereby making it possible to avoid the trouble of failing to interrupt current due to arc current after fuse melting, and thus achieve an electronic device with a favorable fuse function.

Moreover, in the third embodiment, the first connection electrode 52a and the third connection electrode 62a, as well as the second connection electrode 52b and the fourth connection electrode 62b are connected respectively at the side surfaces with the metal films 61a, 61b interposed therebetween, thus making it possible to achieve an electronic device that has a desired fuse function at low cost without the need to form any conducting via.

Furthermore, in this third embodiment, the dimension in the long-side direction of the electronic component is larger than the dimension in the width direction perpendicular to the long-side direction, and the distance can be thus shortened between the third connection electrode 62a and the fourth connection electrode 62b, thus making it possible to improve the flexure strength of the intermediate connection layer 51.

Next, a fourth embodiment of the electronic device according to the present invention will be described.

According to the fourth embodiment, an electronic component and a wiring substrate are configured in the same manner as in the first to third embodiments, whereas an intermediate connection layer has a different structure.

Figure 8:
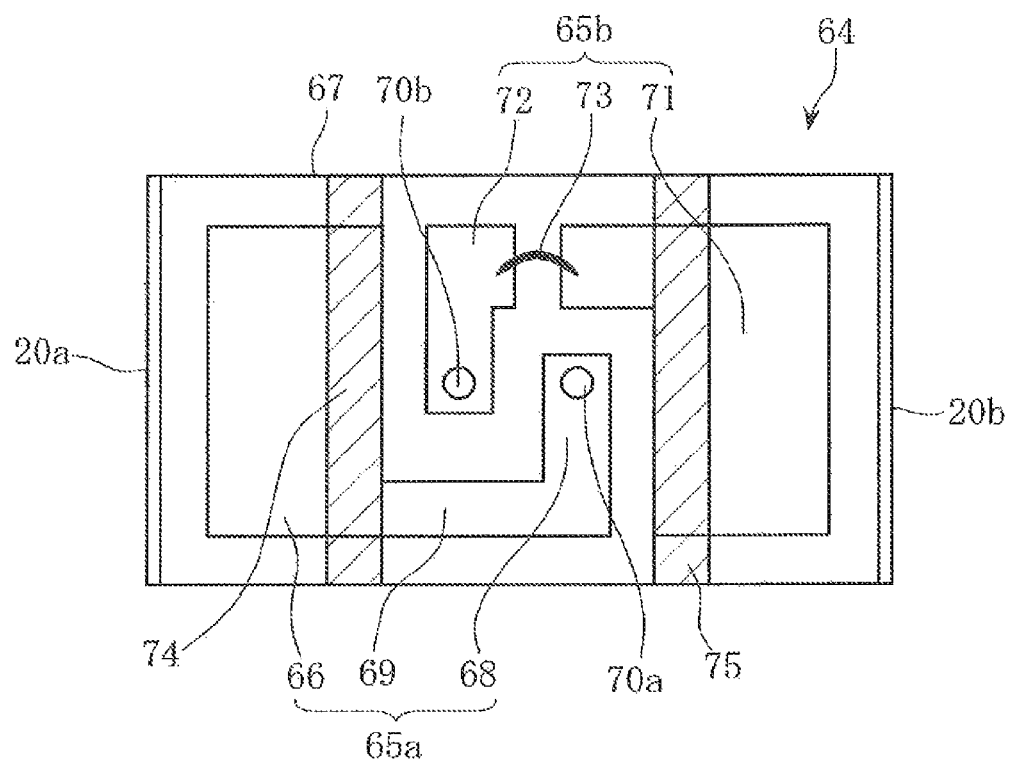
FIG. 8 is a plan view illustrating an intermediate connection layer in a fourth embodiment of an electronic device according to the present invention.

FIG. 8 is a plan view of the intermediate connection layer according to the fourth embodiment.

On the surface of the intermediate connection layer 64, a first connection electrode 65a and a second connection electrode 65b are formed.

The first connection electrode 65a has, as in the first embodiment (see FIG. 3), a main conductor part 66 formed on the surface opposed to a first external electrode 5a, a sub-conductor part 68 formed substantially in the central part of a base 67, and a connection conductor part 69 that connects the main conductor part 66 and the sub-conductor part 68. In addition, a first conducting via 70a is formed at a distal end of the sub-conductor part 68, so as to pass through the base 67.

In addition, the second connection electrode 65b has a main conductor part 71 formed on the surface opposed to a second external electrode 5b, a sub-conductor part 72 formed substantially in the central part of the base 67 so as to be kept from coming into contact with the first connection electrode 65a, and a fuse part 73 of a metal wire for connecting the main conductor part 71 and the sub-conductor part 72. More specifically, the fuse part 73 is formed by bonding connection of the metal wire between the main conductor part 71 and the sub-conductor part 72. Further, as in the first to third embodiments, the fuse part 73 is narrowed in the second connection electrode 65b, and formed to allow the main conductor part 71 and the sub-conductor part 72 to be electrically connected. In addition, a second conducting via 70b is formed at a distal end of the sub-conductor part 72 of the second connection electrode 65b, so as to pass through the base 67.

In addition, on the surface of the intermediate connection layer 64, protective layers 74, 75 of a solder resist or the like is formed so that the first connection electrode 65a and the second connection electrode 65b are kept from coming into electrical contact with each other even when solders 6a, 6b flow therein.

In this regard, the metal wire for the bonding connection is not to be considered limited particularly, but for example, materials such as Al, Au, and Cu can be used which are used commonly for bonding connections. However, from the perspective of ensuring a more favorable fuse function, it is preferable to use Al which has a low melting point, and an excellent cutting function. Further, the bonding connection is made after applying surface treatment to at least connection points with the wire on the main conductor part 71 and sub-conductor part 72 of the second connection electrode 65b. The surface treatment can be carried out, for example by forming a Ni film on the main conductor part 71 and sub-conductor part 72 formed from Cu foil or the like, further forming a Pd film, if necessary, and applying flash plating or the like onto the film surface, thereby forming an Au film.

In addition, the size of the metal wire is also not to be considered limited as long as the metal is used commonly for bonding connections, but for example, a metal wire on the order of 0.1 mm in diameter and 1.5 mm in length can be used.

It is to be noted that the bottom of the intermediate connection layer 64 has the same structure as in the first embodiment (see FIG. 4).

In the thus configured electronic device, as in the first to third embodiments, even when a large current flows to the mounted electronic component 2, thereby breaking the electronic component 2, the fuse part 73 melts down to make the circuit open, thereby making it possible to minimize the influence on peripheral mounted parts, and prevent the mounting substrate from burning out, igniting, or the like.

Further, the fuse part 73 is formed inside the second connection electrode 65b, that is, between one main conductor part 66 as a surface opposed to the first external electrode 5a and the other main conductor part 71 as a surface opposed to the second external electrode 5b. Thus, as compared with cases of forming the fuse part near the end of the intermediate connection layer 64 or in the height direction of the intermediate connection layer 64 as in conventional cases, the degree of freedom for fuse design is increased without increasing the size or height of the device, thereby making it possible to avoid the trouble of failing to interrupt current due to arc current after fuse melting, and thus achieve an electronic device with a favorable fuse function.

Moreover, in this fourth embodiment, the fuse part 73 is formed by bonding connection with the metal wire in the second connection electrode 65b, thus making it possible to suspend the fuse part 73 from the base 67. Therefore, the fuse part 73 in direct contact with the base 67 can be avoided. Accordingly, the heat conduction from the fuse part to the intermediate connection layer is suppressed, thereby making it possible to reduce the meltdown time, and prevent the intermediate connection layer from igniting.

Figure 9:
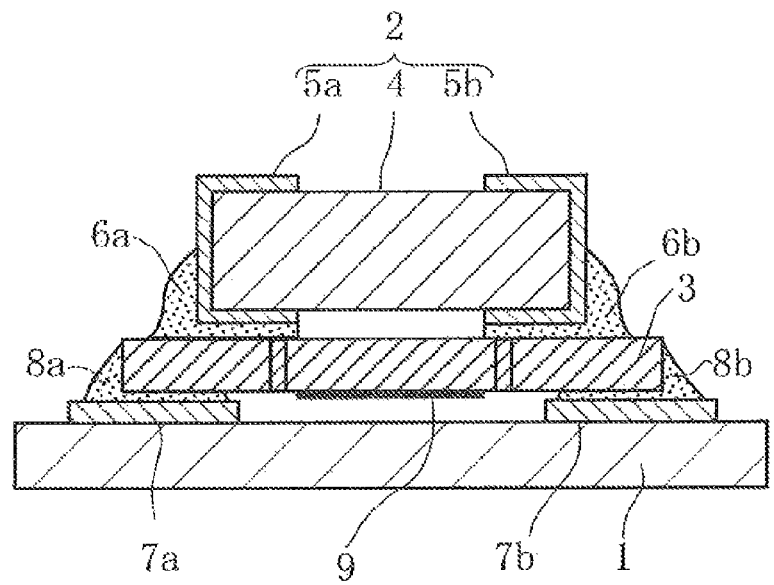
FIG. 9 is a cross-sectional view illustrating a fifth embodiment of an electronic device according to the present invention.
Figure 9:
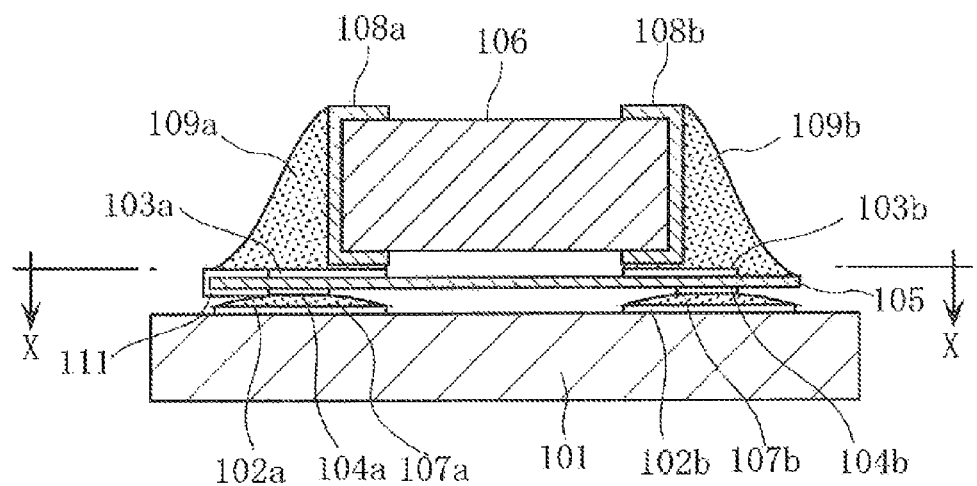

It is to be noted that the present invention is not to be considered limited to the embodiments described above, but modifications can be made without departing from the scope of the invention. While the fuse parts 9, 39, 58, 73 are provided on the surfaces opposed to the electronic component 2, that is, on the front surfaces of the intermediate connection layer 3 in the embodiments described above, the fuse part 9 may be provided on the surface opposed to the wiring substrate, that is, the back surface of the intermediate connection layer 3 as in the fifth embodiment shown in FIG. 9.

In addition, the fuse part 58 is formed in the long-side direction of the intermediate connection layer 51 in the third embodiment, but may be formed in the short-side direction as in the second embodiment.

Furthermore, while the connection electrodes with the same electrode patterns as in the first embodiment are illustrated with the fuse part formed from the metal wire in the fourth embodiment, it is obvious that similar function effects to those of the fourth embodiment will be obtained even when the respective fuse parts are formed by bonding connection with metal wires in the second, third, and fifth embodiments.

Next, examples of the present invention will be specifically described.

Example 1

The intermediate connection layer presented in the first embodiment was prepared (see FIGS. 2 and 3).

More specifically, prepared was a base made from glass-epoxy of 0.8 mm in thickness with Cu thin films formed on both front and back surfaces.

Then, holes were provided with a drill in predetermined positions of the base, and openings were further provided at an interval of 8.4 mm. This base was subjected to Cu plating to fill the inside of the holes with Cu, thereby forming conducting vias, and a Cu film was further formed on the inner surfaces of the openings.

Then, a well-known technique of photolithography was used to form first and second connection electrodes on the front surface of the base, and third and fourth connection electrodes on the back surface of the base.

It is to be noted that the external dimensions of a fuse part formed in the second connection electrode were made 0.07 mm in width, 3.0 mm in length, and 0.005 mm in thickness.

Next, a solder resist was applied to a predetermined region of the base to form a protective layer, and thereafter, measurement samples of 8.4 mm in length, 5.0 mm in width, and 0.8 mm in thickness were prepared by cutting at an interval of 5.0 mm.

For 20 of the measurement samples, the first and second connection electrodes were connected with a leading wire, and short-circuited, and a direct current was applied between the third and fourth connection electrodes to evaluate the fuse function. It has been confirmed that the fuse part melts down when a predetermined direct current is applied, thereby fulfilling the fuse function.

Example 2

The intermediate connection layer presented in the fourth embodiment was prepared (see FIG. 8).

More specifically, measurement samples were prepared in accordance with the same method and procedure as in Example 1, except that the fuse part according to Example 1 was formed from a metal wire of Al.

It is to be noted that the fuse part was prepared by the following method. After forming a Ni film by plating on connection points and surrounding Cu film of the metal wire of Al, forming an Au film applying flash plating as surface treatment, the main conductor part and the sub-conductor part were connected by bonding with the Al wire of 0.1 mm in diameter and 1.5 mm in length, thereby preparing the fuse part composed of the metal wire of Al.

For 20 of the measurement samples, the first and second connection electrodes were connected with a leading wire, and short-circuited, and a direct current was applied between the third and fourth connection electrodes to evaluate the fuse function. It has been then confirmed that as compared with Example 1, the fuse part melts down in a shorter period of time, thereby fulfilling the favorable fuse function.

Electronic devices are achieved which can ensure a desired fuse function without causing the device itself to undergo an increase in size.

DESCRIPTION OF REFERENCE SYMBOLS

1: wiring substrate (substrate)
2: electronic component
3, 31, 51, 64: intermediate connection layer
7a: first land electrode (land electrode)
7b: second land electrode (land electrode)
9, 39, 58, 73: fuse part
11a, 32a, 52a, 65a: first connection electrode (connection electrode)
11b, 32b, 52b, 65b: second connection electrode (connection electrode)
12a, 35a, 70a: first conducting via (conducting via)
12b 35b, 70b: second conducting via (conducting via)
21a, 42a, 62a: third connection electrode (connection electrode)
21b, 42b, 62b: fourth connection electrode (connection electrode)
54, 57: extended part

The invention claimed is:

1. An electronic device comprising:
a substrate having first and second land electrodes;
an electronic component having first and second opposed lateral end surfaces on which first and second external electrodes, respectively, are formed;
an intermediate connection layer interposed between the substrate and the electronic component, the intermediate connection layer having opposed first and second principal surfaces; and
a first set of connection electrodes including a first connection electrode located on the first principal surface of the intermediate connection layer and a second connection electrode located on the second principal surface of the intermediate connection layer, the first set of connection electrodes electrically connecting the first land electrode and the electronic component;
a second set of connection electrodes including a third connection electrode located on the first principal surface of the intermediate connection layer and a fourth connection electrode located on the second principal surface of the intermediate connection layer, the second set of connection electrodes electrically connecting the second land electrode and the electronic component;
a first set of protective layers on the first principal surface of the intermediate connection layer and positioned to prevent the first and third connection electrodes from coming into electrical contact with one another;
a second set of protective layers on the second principal surface of the intermediate connection layer and positioned to prevent the second and fourth connection electrodes from coming into electrical contact with one another; and
one of the connection electrodes having a fuse part which is located:
(a) under the electronic component so as to be sandwiched between the electronic component and the substrate; and
(b) between the opposed lateral end surfaces of the electronic component.

2. The electronic device according to claim 1, wherein the fuse part is in a narrowed shape relative to other portions of the one of the connection electrodes, and extends along a long-side direction of the intermediate connection layer.

3. The electronic device according to claim 1, wherein the fuse part is in a narrowed shape relative to other portions of the one of the connection electrodes, and extends along a short-side direction of the intermediate connection layer.

4. The electronic device according to claim 1, wherein the fuse part is a metal wire.

5. The electronic device according to claim 1, wherein the fuse part is located between the first principal surface of the intermediate connection layer and opposed to the electronic component.

6. The electronic device according to claim 1, wherein the fuse part is on the second principal surface of the intermediate connection layer opposed to the substrate.

7. The electronic device according to claim 1, further comprising a conducting via in the intermediate connection layer, the conducting via electrically connecting the first and second connection electrodes on the opposed first and second principal surfaces of the intermediate connection layer.

8. The electronic device according to claim 7, wherein the at least one of the connection electrodes having an L-shaped portion, the fuse part being located in the L-shaped portion.

9. The electronic device according to claim 8, wherein the fuse part is located in the L-shaped portion proximal to the conducting via.

10. The electronic device according to claim 1, further comprising an extended part on a side surface of the intermediate connection layer, the extended part electrically connecting the first and second connection electrodes on the opposed first and second principal surfaces of the intermediate connection layer.

11. The electronic device according to claim 1, further comprising a metal film on an end surface of the intermediate connection layer.

12. The electronic device according to claim 1, further comprising a metal film on a side surface of the intermediate connection layer.

13. The electronic device according to claim 1, wherein the at least one of the connection electrodes having an L-shaped portion, the fuse part being located in the L-shaped portion.

14. The electronic device according to claim 1, wherein the first and third connection electrodes overlap one another and the fuse part is located in the area where the first and second connection electrodes overlap one another.

15. The electronic device according to claim 1, wherein the first set of protective layers comprises first and second protective layers, the first protective layer being located on the first connection electrode, the second protective layer being located on the third connection electrode.

16. The electronic device according to claim 1, wherein the second set of protective layers comprises a single protective layer located on the second and fourth connection electrodes.

17. The electronic device according to claim 1, wherein:
the first connection electrode is soldered to the first external electrode, the second electrode is soldered to the first land electrode, the third connection electrode is soldered to the second external electrode and the fourth connection electrode is soldered to the second land electrode;
the first set of protective layers prevents solder on the first connection electrode from reaching the third connection electrode and solder on the third connection electrode from reaching the first connection electrode; and
the second set of protective layers prevents solder on the second connection electrode from reaching the fourth connection electrode and solder on the fourth connection electrode from reaching the second connection electrode.

\* \* \* \* \*